United States Patent
Dhas et al.

(10) Patent No.: US 8,017,527 B1
(45) Date of Patent: Sep. 13, 2011

(54) METHOD AND APPARATUS TO REDUCE DEFECTS IN LIQUID BASED PECVD FILMS

(75) Inventors: Arul N. Dhas, Sherwood, OR (US); Ming Li, West Linn, OR (US); Joseph Bradley Laird, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 247 days.

(21) Appl. No.: 12/336,386

(22) Filed: Dec. 16, 2008

(51) Int. Cl.
*H01L 21/31* (2006.01)
*H01L 21/469* (2006.01)
*A23G 3/24* (2006.01)
*B05C 3/00* (2006.01)
*B01D 47/00* (2006.01)
*F02M 37/00* (2006.01)
*F02M 69/02* (2006.01)
*F02M 5/08* (2006.01)
*B01F 5/04* (2006.01)

(52) U.S. Cl. . 438/778; 438/780; 438/781; 257/E21.094; 257/E21.477; 118/429; 118/723 E; 118/29; 261/34.1; 261/38; 261/42; 261/44.2; 261/76

(58) Field of Classification Search .......... 438/680, 438/497, 500, 778, 780, 781; 118/429, 723 E, 118/29; 261/34.1, 38, 42, 44.2, 76, DIG. 39
See application file for complete search history.

(56) References Cited

U.S. PATENT DOCUMENTS

2005/0161158 A1* 7/2005 Schumacher ............ 156/345.29

OTHER PUBLICATIONS

U.S. Appl. No. 11/396,303, filed Mar. 30, 2006, Dhas, et al.
U.S. Appl. No. 11/602,564, filed Nov. 20, 2006, Henri, et al.

* cited by examiner

*Primary Examiner* — Michelle Estrada
(74) *Attorney, Agent, or Firm* — Weaver Austin Villeneuve & Sampson LLP

(57) ABSTRACT

Apparatuses and methods for diverting a flow of a liquid precursor during flow stabilization and plasma stabilization stages during PECVD processes are effective at eliminating particle defects in PECVD films deposited using a liquid precursor.

27 Claims, 5 Drawing Sheets

METHOD AND APPARATUS TO REDUCE DEFECTS IN LIQUID BASED PECVD FILMS

FIELD OF THE INVENTION

The present invention pertains to apparatuses and methods for depositing a dielectric film on a substrate. More specifically, the invention pertains to apparatuses and methods for diverting a flow of a liquid precursor during flow stabilization and plasma stabilization stages of the PECVD process. The invention is effective at eliminating particle defects in PECVD films deposited using a liquid precursor.

BACKGROUND OF THE INVENTION

Deposition of thin films is one of the key processes in semiconductor manufacturing. A typical wafer goes through deposition of several thin films, some of which may completely or partially remain in the final electronic device. Certain types of films are deposited using liquid precursors, for example tetra-ethyl-ortho-silicate (TEOS). TEOS provides excellent conformality of the deposited silicon dioxide in comparison to gaseous precursors.

Films deposited using TEOS or other liquid precursors are often deposited using a plasma enhanced deposition chemical vapor deposition (PECVD) process. PECVD processes based on liquid precursors typically involve exposing a substrate to precursor vapor and an oxidant, such as oxygen or ozone, in the presence of plasma. Such processes often generate many particles during precursor flow stabilization. Particles may be generated due to the condensation and thermal decomposition of the precursors inside the chamber. The problem may be become even more severe due to transient ignition envelopes, i.e., periods of building up plasma.

SUMMARY

The present invention pertains to apparatuses and methods for diverting a flow of a liquid precursor during flow stabilization and plasma stabilization stages of PECVD processes. These apparatuses and methods have proven to be effective in eliminating particle defects in PECVD films deposited using a liquid precursor. When a liquid precursor is initially introduced into the deposition system, it is first directed into a divert line of a liquid precursor delivery system and not the deposition chamber. This diversion prevents with the precursor from reaching internal components of the chamber and a wafer during stabilization of the two process parameters, i.e. the precursor flow rate and the plasma power. Significant particle reduction results from eliminating this contact during the stabilization stages. The flow is directed into the chamber only when both parameters are stabilized.

In certain embodiments, the liquid precursor delivery system includes a process line, a divert line, and a valve-injector assembly. The assembly includes two injectors, i.e., a divert injector and a process injector, and a flow control mechanism. The system may include multiple assemblies, for example, one configured for a high flow rate and another configured for a low flow rate. The low flow rate may be between about 1 ml/sec and 10 ml/sec, while the high flow rate may be between about 10 ml/sec and 30 ml/sec.

The flow control mechanism is connected with the divert injector, which is further connected with the divert line, and the process injector, which is further connected with the process line. The mechanism is used for switching the flow of the liquid precursor between the divert injector and the process injector. The mechanism may include a set of valves, e.g., a divert valve connected with the divert injector and a process valve connected with the process injector. In certain embodiments, the process valve is configured to open only when the divert valve is closed. In one example, a mechanism includes a three-way valve.

The divert injector is configured to control a flow rate of the liquid precursor into the divert line, while the process injector is configure to control a flow rate of the liquid precursor into the process line. In certain embodiments, the flow rate into the divert line is within about 10% from the flow rate into the process line.

In certain embodiments, the delivery system includes a purging line for purging valve-injector assemblies when the liquid precursor is not flown through the system. The divert line may provide a flow of a carrier gas at between about 10 Standard Liters per Minute (SLM) and 50 SLM and maintain the temperature of the carrier gas at between about 100° C. and 200° C. In the same or other embodiments, the process line of delivery system a heated injection module (HIM) connected with the process injector and configured to maintain the temperature of the liquid precursor at greater than about 80° C. before entering the deposition chamber inlet. The system may also include a process gas line connected with the heated injection module. In these embodiments, the heated injection module is configured to combine the liquid precursor from the process injector and one or more process gases from the process gas line and maintain the temperature of the combination at greater than about 80° C. entering the deposition chamber inlet.

The delivery system may also include a controller configured to control operation of the flow control mechanism and execute a set of instructions. In certain embodiments, these instructions include initiating the flow of the liquid precursor into the divert line, stabilizing the flow of the liquid precursor while the liquid precursor continues to flow into the divert line, and introducing the stabilized flow of the liquid precursor into the process line.

Different embodiments of the delivery systems described above may be a part of an overall deposition system, which may also include a deposition chamber with an inlet, a RF generator for generating plasma in using a process gas. The deposition system may include its own controller configured to execute a set of instructions that include initiating a flow of the liquid precursor into the divert line, initiating a flow of one or more processes gases into the deposition chamber, igniting the plasma using the RF generator and the one or more processes gases, stabilizing the flow of the liquid precursor while the liquid precursor continues to flow into the divert line, stabilizing power of the plasma, and introducing the stabilized flow of the liquid precursor into the deposition chamber after the power of the plasma is stabilized.

The present invention is also directed to a deposition method. In certain embodiments, the method is used to form a dielectric material on a semiconductor substrate and includes initiating a flow of a liquid precursor into a divert line, initiating a flow of one or more processes gases into a deposition chamber, igniting a plasma using a RF generator and the one or more processes gases, stabilizing the flow of the liquid precursor while the liquid precursor continues to flow into the divert line, stabilizing power of the plasma, and introducing the stabilized flow of the liquid precursor into the deposition chamber after the power of the plasma is stabilized. The stabilized flow may be introduced into the deposition chamber within 0.5 seconds from stabilizing the power of the plasma. In the same or other embodiments, the initiating the flow of the liquid precursor into the divert line is synchronized in time with the igniting the plasma such that the flow of the liquid precursor and the power of the plasma are stabilized within 0.5 seconds.

The precursor may include one or more tetra-ethyl-orthosilicates. In certain embodiments, the stabilized flow of the precursors into the chamber is between about 10 ml/sec and 30 ml/sec. The stabilizing of the flow may take between about 0.5 seconds and 3.0 seconds. During stabilization the precursor is diverted into the divert line, which may be maintained at between about 3 Torr and 150 Torr and has a flow rate of 3 SLM and 10 SLM of a divert gas at between about 100° C. and 200° C. The divert gas may include nitrogen.

In certain embodiments, the flow rate of the liquid precursor is between about 4.0 ml/min and 17.0 ml/min prior to its vaporization in the HIM. The process gases may include oxygen with a flow rate of between about 4,000 standard cubic centimeters per minute (sccm) and 25,000 sccm and/or helium with a flow rate of between about 0 sccm and 10,000 sccm. The deposition chamber pressure is maintained at between about 1.8 Torr and 3.6 Torr in certain embodiments. These process conditions typically correspond to deposition rates of between about 3,500 Angstrom/min and 9,000 Angstrom/min. Deposited films may have residual stress of between about 0 MPa (stress of neutral) and 150 MPa compressive.

Using a liquid precursor delivery system described above helps to reduce defect levels in films deposited using liquid precursors to below 50 particles per wafer having size 0.1 μm or greater,

DETAILED DESCRIPTION OF A PREFERRED EMBODIMENT

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.
Introduction In this application, the terms "substrate" and "wafer" will be used interchangeably. The following detailed description assumes the invention is implemented on a semiconductor wafer. However, the invention is not so limited. The work piece may be of various shapes, sizes, and materials. In addition to semiconductor wafers, other work pieces that may take advantage of this invention include various articles such as display front planes printed circuit boards and the like.

The term "stabilized" as applied to a process parameter means that this parameter has reached its steady state. For example, when a liquid precursor is initially introduced into the system, its flow rate initially increases until it reaches the set value. In some instances, the parameter may exceed and drop below the set-value before reaching the steady state. Typically, upper and lower process control limits are set for a process parameter. When the process parameter is continuously maintained between the limits it is said to be stabilized. A period of time that is required for a process parameter to become stabilized is referred to as "a stabilization period" or "stabilization."

Figure 1:
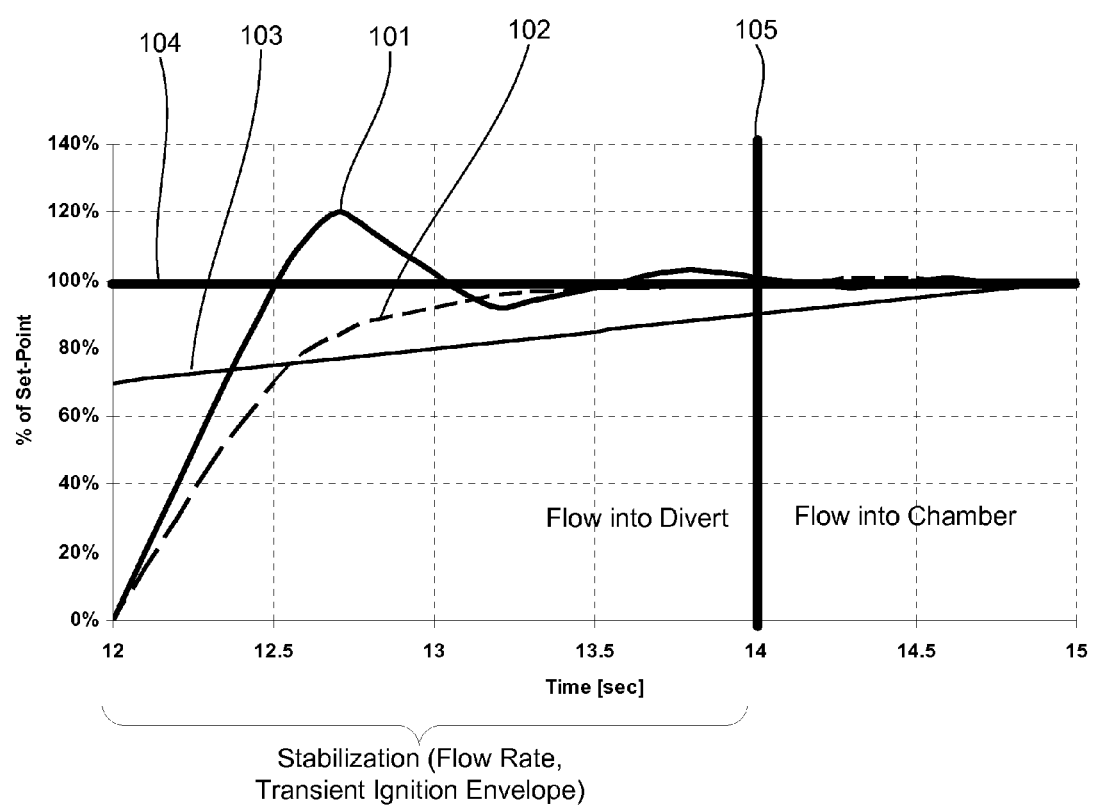
FIG. 1 is a reference plot of several process parameters as a function of time at the beginning of the process.

FIG. 1 is a reference plot of several process parameters as a function of time at the beginning of the process in accordance with one embodiment of the invention. Values for each parameter are expressed as percentages relative to their set-points to provide a common basis. The set-point, i.e., 100% mark, is reflected as a solid thick line 104.

The line 101 represents a flow rate of a liquid precursor that is measured at an outlet of a process injector. This flow rate provides a good representation of the precursor supply into the deposition chamber. In this example, the precursor is not introduced into the system until after 12 seconds from the beginning of the process, e.g., positioning of a wafer on a pedestal. It should be noted that any reference point may be used to identify the beginning of the process. When a valve introducing the liquid precursor into the deposition system is first opened there is no immediate flow at the outlet of the process injector. In other words, the flow is 0% of the set point at exactly 12 seconds. It takes some time for the internal lines of the liquid flow controller (LFC), including the process injector, to get filled. During this time the flow rate increases. It should be noted that the values (and resulting shapes of the curves) presented in FIG. 1 are for illustrative purposes only and should not be treated as limiting. Initially, formation of gas pockets, surface tension, and other phenomena may cause the flow rate 101 to fluctuate around the set-point 104 before reaching the steady state, i.e. becoming stabilized.

In certain embodiments, the flow rate is determined to be stabilized when any further fluctuations are less than 30% from the set point, or more specifically less than 20%. In some specific embodiments, the flow rate is controlled to be within about 99% of the set point. High fluctuations have negative impact on resulting film composition and plasma impedance during the transition ignition envelope. The plasma impedance dependent on a precursor concentration causing the matching network to adjust the impedance of the plasma to match the process impedance leading to defects. In FIG. 1 example, the flow rate of the liquid precursor 101 is determined to be stable at 14 seconds that is highlighted with a vertical line 105. The period between introducing the liquid precursor (at 12 seconds) and achieving the stabilized flow (at 14 seconds) is referred to as a liquid precursor stabilization period. It should be noted that this stabilization period generally depends on the targeted flow rate (i.e. the set point), fluctuation allowance of a stabilized flow (i.e. the upper and lower control limits), lines sizes and geometries, liquid precursor properties, and other process parameters. The liquid precursor stabilization period should be distinguished from stabilization periods for other process parameters, for example a plasma power stabilization period described below.

A dashed line 102 represents a power level of plasma measured at the electrode surface where the RF power is provided. In the example presented in FIG. 1, one or more RF generators are activated at 12 seconds. A process gas is flown into the chamber at about the same time. The plasma is ignited, and the plasma power 102 increases towards its set point, i.e., the line 104. At certain point, the power level 102 may reach its steady state. In the presented example the plasma power 102 is determined to be stabilized at 14 second, also highlighted by the vertical line 105. The plasma power stabilization period, i.e., a time period between the activation of the RF generator (and/or introduction of one or more process gases) and achieving the stabilized plasma power, may depend on the power settings (i.e. the set point), fluctuation allowance of the stabilized power (i.e. the upper and lower control limits), RF generator characteristics, flow rates and properties of the process gases, and other process parameters. The plasma power stabilization period is sometimes also referred to as a transient ignition envelope. It should be noted that while the example illustrated in FIG. 1 presents the two coinciding stabilization periods, i.e., the liquid precursor stabilization period starts and ends together with the plasma power stabilization period, any relative positions and durations of the two stabilization periods are possible.

A thin solid line 103 represents the temperature of the wafer's front-side surface. The wafer may be positioned on a heated pedestal at the beginning of the process (0 seconds). The temperature 103 then gradually increases due to the heat transfer from the pedestal. When the plasma is ignited (at 12 seconds in the FIG. 1 example) the wafer may be additionally heated by the plasma energy.

Particles may form and uncontrolled deposition may occur when the plasma and the liquid precursor are combined in the deposition chamber before either the plasma power or the liquid precursor flow rate has reached its respective steady state, i.e., the process parameter is stabilized. For example, when a precursor is introduced before the plasma is ignited or when the power of the plasma is still very low, the precursor may condense on the wafer and/or thermally decompose due to plasma ignition or plasma power ramp up. Both phenomena are highly undesirable because they lead to particle formation.

After extensive experimentation, it has been unexpectedly found that a liquid precursor flow and plasma power may be stabilized before being the precursor is introduced into the deposition chamber. To achieve this, a liquid precursor may be first flown into a divert line while the flow and plasma power stabilize. The liquid precursor may be then redirected into the deposition chamber after both process parameters reach their respective steady states. The switching of the flow is done in such way that the liquid precursor continues to maintain its stabilized flow rate. The implementing hardware can be designed to minimize disruptions of the steady state during switching. For example, it has been found that two lines can be equipped with the same or similar functioning injector. Additionally, comparable process conditions (pressure, temperature) can be maintained at the injector outlets.

Apparatus

Certain embodiments of the present invention are implemented in a plasma enhanced chemical vapor deposition (PECVD) system 200. Such systems may take many different forms. Generally, the system 200 will include one or more deposition chambers or "reactors", each configured to process one or more wafers. In certain specific embodiments, a system is a Vector™ or Sequel™ system, produced by Novellus Systems of San Jose, Calif.

Figure 2:
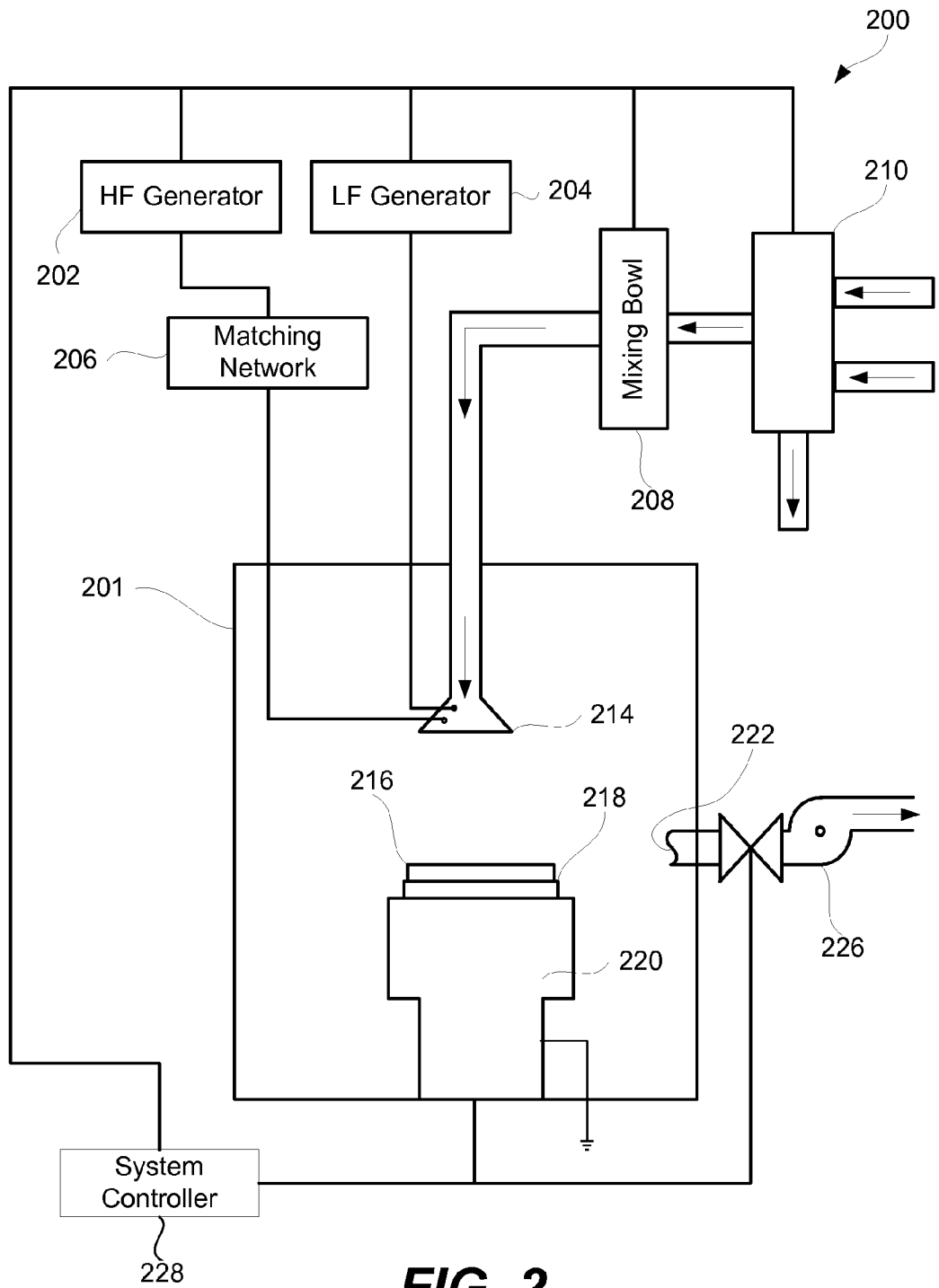
FIG. 2 is a general block diagram of a deposition system in accordance with certain embodiments.

FIG. 2 illustrates a simplified block diagram of the deposition system 200 in accordance with certain embodiments. As shown, the system 200 includes a process chamber 201, which contains a substrate 216 for depositing a thin film. The plasma may be generated by a capacitor type system including a showerhead 214 that works in conjunction with a grounded heater block 220. The system includes one or more RF generators. For example, a high-frequency (HF) generator 202 may be connected to a matching network 206. Another low-frequency (LF) generator 204 may be connected to the showerhead 214. In an alternative embodiment, the LF generator 204 is connected to a wafer pedestal 218. The power and frequency supplied by the matching network 206 is sufficient to generate plasma from the process gases. In certain embodiments, the HF generator operates at frequencies of between about 2 MHz and 60 MHz, more specifically at about 13.56 MHz. In the same or other embodiments, the LF generator operates at between about 100 kHz and 800 kHz, or more specifically at between about 300 kHz and 500 kHz. The power outputs for the HF generator may be between about 200 W and 2,000 W, more specifically between about 200 W and 700 W. The power output of the LF generator may be between about 200 W and 2,400 W, more specifically between about 800 W and 2,200 W.

The process chamber 201 includes a wafer pedestal 218 for supporting the substrate 216. The pedestal 218 typically includes a chuck, a fork, and/or lift pins to hold and transfer the substrate 216 during and between various operations. The chuck may be an electrostatic chuck, a mechanical chuck, or any other suitable type of chuck. The wafer pedestal 218 is functionally coupled with a grounded heater block 220 for heating the substrate 216 to a desired temperature. Generally, the substrate 216 is maintained at a temperature in a range of about from 25° C. to 500° C., more specifically in a range of about from 350° C. to 425° C.

Process gases and precursors are introduced into the chamber 201 through the showerhead 214. The showerhead 214 is directly connected to the mixing bowl 208, where the process gases and precursors are mixed before being introduced into the chamber 201. The process gases and precursors are supplied into the bowl 208 from the liquid precursor delivery system 210. The details of the delivery system 210 are further described with reference to FIG. 3.

Remaining gases exit the chamber 201 via an outlet 222. A vacuum pump 226 (e.g., a one or two stage mechanical dry pump and/or a turbo-molecular pump) typically draws the gases out and maintains a suitably low pressure within the chamber 201, for example, by a closed loop controlled flow restriction device, such as a throttle valve or a pendulum valve. During deposition, the chamber 201 may be maintained at between about 0.1 Torr and 30 Torr, more specifically between about 4 Torr and 12 Torr. The chamber 201 may be at a lower pressure, for example between about 0.05 Torr and 1 Torr at the beginning of the overall process, e.g., loading the substrate 216.

In certain embodiments, a system controller 228 is used to control process conditions for various operations of the deposition method described below. For example, the controller 228 may control valves of the delivery system 210 for directing flow of a liquid precursor into a divert injector or into a process injector and subsequently into the process chamber 201. The controller 228 typically includes one or more memory devices and one or more processors. The processor may include a CPU or computer, analog, and/or digital input/output connections, stepper motor controller boards, etc.

In certain embodiments, the controller 228 controls all of the activities of the system 200. The controller 228 executes system control software including sets of instructions for controlling the timing of the processing operations, frequency, and power of operations of RF generators, flow rates, temperatures, and mixing conditions of precursors and process gases, temperature of the pedestal, pressure of the chamber, and other process parameters. Other computer programs stored on memory devices associated with the controller 228 may be employed in some embodiments.

Typically there will be a user interface associated with controller 228. The user interface may include a display screen, graphical software displays of the apparatus and/or process conditions, and user input devices such as pointing devices, keyboards, touch screens, microphones, etc.

The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates, and temperatures of precursors and process gases, temperature of the substrate, pressure of the chamber and other parameters of a particular process. These parameters are provided to the user in the form of a recipe, and may be entered utilizing the user interface.

The system software may be designed or configured in many different ways. For example, various chamber component subroutines or control objects may be written to control operation of the chamber components necessary to carry out the inventive deposition processes. Examples of programs or sections of programs for this purpose include substrate timing of the processing steps code, flow rates, and temperatures of precursors and inert gases code, and a code for pressure of the chamber.

The invention may be implemented on a multi-station or single station tool. In specific embodiments, the 300 mm Novellus Vector™ tool having a 4-station deposition scheme or the 200 mm Sequel™ tool having a 6-station deposition scheme are used.

Liquid Precursor Delivery System

Figure 3:
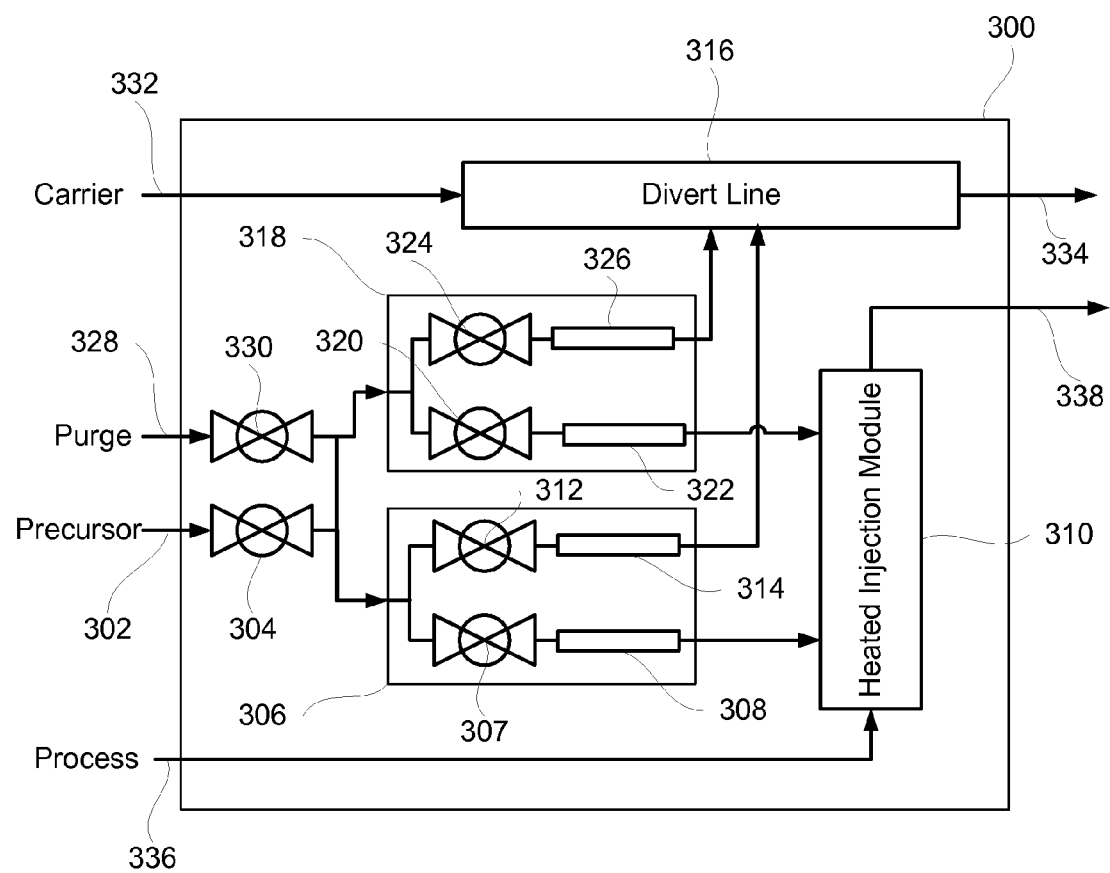
FIG. 3 is a block diagram of a liquid precursor delivery system in accordance with an embodiment of the present invention that illustrates different flow paths used during the stabilization and deposition stages of the process and the hardware for controlling various flows.

FIG. 3 illustrates a simplified schematic diagram of a liquid precursor delivery system 300 in accordance with certain embodiments of the invention. A liquid precursor enters the system 300 through a precursor inlet line 302. The line 302 may be fitted with a coupling configured for connection with various types of liquid precursor supplies, e.g., storage tanks, facility lines, etc. (not shown). The line 302 has a precursor inlet valve 304 that controls introduction of the liquid precursor into the system 300. The valve 304 may be operated alternatively with a purging inlet valve 330 that is used to purge various components of the system 300 of the precursor residues.

The precursor inlet valve 304 is opened to allow the liquid precursor to flow into one of the valve-injector assemblies (306 and 318). The valve-injector assemblies (306 and 318) are used to control the flow rate of the liquid precursor and to direct the liquid precursor to a divert line 316 or to a process outlet 338. In certain embodiments, the system 300 includes multiple valve-injector assemblies configured for different flow rates. For example, FIG. 3 illustrates the system 300 with two valve-injector assemblies: a high flow-rate assembly 318 and a low flow-rate assembly 306. The high flow-rate assembly 318 is fitted with two high flow-rate injectors (322 and 326), while the low flow-rate assembly 308 is fitted with two low flow-rate injectors (308 and 314). The high-flow rate injectors (322 and 326) may be configured for the flow rates of between about 10 ml/sec and 30 ml/sec, for example. In one embodiment, a high-flow rate injector has an internal diameter of about 0.015 inches. The low-flow rate injectors (322 and 326) may be configured for the flow rates of between about 1 ml/sec and 10 ml/sec, for example. In one embodiment, a low-flow rate injector has an internal diameter of about 0.007 inches.

Operation of the valve-injector assemblies can be be explained with reference to a particular assembly, e.g. 306. It should be understood that other assemblies may operate in a similar manner. Any number of valve-injector assemblies may be used in the system 300. One example of a divert valve is a Swagelok 6LVV-A31D20426DU-AAS3 available from various suppliers, such as Swagelok Ventura in Camarillo, Calif.

The valve-injector assembly 306 includes two valves: a process valve 307 and a divert valve 312. The process valve 307 controls the flow of the liquid precursor into the process chamber (through other components of the delivery system 300 and the overall deposition system). The divert valve 312 controls the flow of the liquid precursor to the divert line 316 (through other elements). In certain embodiment, the process valve 307 and the divert valve 312 are configured to operate alternatively, i.e. when the process valve 307 is open the divert valve 312 is closed and vice versa. A displacement sensor may be employed to monitor and control respective valve positions. In some embodiments, the two valves (the process valve 307 and the divert valve 312) may be combined into one three-way valve. Furthermore, other devices and mechanisms may be used to switch the flow between the two directions identified above.

When a liquid precursor is initially introduced into the system 300, it goes through a flow stabilization phase further explained with reference to FIG. 1. The process valve 307 is closed at this point, while the divert valve 312 is opened. The liquid precursor is directed through a divert injector 314 and into the divert line 316. As it is described above, each injector is rated to a specific flow rate. Typically, both the process injector 308 and the divert injector 322 in the same assembly are rated to the same flow rate and control the flow rate in the same manner with similar process conditions, e.g., pressure drop, linear velocity. However, geometries of the injectors can be modified and adopted for the system requirements while providing the same flow restriction.

When the flow rate is stabilized and the process chamber is ready for delivering the liquid precursor, the divert valve 312 is closed and the process valve 307 is opened. The liquid precursor is the now directed through the process injector 308. The process injector 308 is configured to prevent any substantial disruptions to the flow rate when the direction of the flow is switched.

From the process injector 308, the liquid precursor may flow into a heated injection module 310. The module 310 is configured to maintain the temperature of the liquid precursor leaving the module 310, for example at between about 80° C. and 300° C., more specifically at between about 130° C. and 170° C.

The module 310 may also be used to mix the liquid precursor with process gases supplied through a process gas line 336. The processes gases may be helium and oxygen flown up to 50,000 sccm, more specifically between about 5,000 sccm and 20,000 sccm.

The precursors and the process gas (if used) leave the heated injection module 310 through the process outlet 338. The outlet 338 is configured to connect with other components of the overall deposition system, for example a mixing bowl. From the mixing bowl the process gasses is directed to the shower head.

The divert line 316 may be a stainless steel pipe having a diameter of between about ⅛" and 2" in diameter or any other suitable geometry and material. The divert line 316 is configured to flow nitrogen, helium, argon, oxygen, carbon oxide, combinations thereof, or any other suitable carrier gas. The flow rate of the carrier gas may be between about 10 SLM and 100 SLM, more specifically between about 20 SLM and 40 SLM. The divert line 316 may have a divert line inlet 332 configured to connect to a carrier gas supply (not shown). The carrying gas may be preheated, for example to between about 100° C. and 200° C. before being introduced into the divert line 316. Alternatively, the divert line 316 may be equipped with a heater to heat the carrier gas to the temperature range specified above. The divert line 316 may be purged at the end of the deposition cycle, e.g. the divert line 316 is vacuumed in parallel with the process chamber in order to avoid any residual build up of the liquid precursor. The pressure in the divert line 316 at the points where the divert injectors 314 and 326 are connected is maintained comparable to the pressure inside the heated module 310. Controlling the pressure ensures that the same flow rate is maintained through the divert injector 314 and the process injector 308. The carrier gas and any diverted liquid precursor are then discharged from the divert line 316 through the discharge outlet 334.

The system 300 may also be configured to periodically purge valves, injectors, lines and other components of the system 300 of precursor residues. The purging may be performed when the deposition system is in idle mode, during a cleaning or maintenance cycle, or when switching to a new formulation of precursors. During purging, the precursor valve 304 is closed and no precursor is allowed into system 300. A purge valve 330 is opened, and a purging gas is flowed through a purge inlet 328 into the system 300. The purging gas may be, for example, oxygen, ozone, argon, helium, carbon dioxide, nitrous oxide or nitrogen, or a combination of these gases and supplied at flow rates of between about 5 SLM and 25 SLM. A purging operation may be performed in several different ways. In one embodiment, all valves (307, 312, 320, and 324 as shown in FIG. 3) in all valve-injector assemblies (307 and 318) are opened for the purging gas to simultaneously flow through. In other embodiments, only the valves of one of the valve-injector assemblies (either 307 or 318) are opened. The latter embodiment may be needed when two or more assemblies are configured for substantially different flow rates of the liquid precursor and provide substantially different restrictions to purge gas flows. Therefore, to avoid the purging gas escaping through the least restrictive path only the paths with comparable restrictions, i.e., flow rate configurations, are opened simultaneously. Alternatively, each valve and a corresponding injector may be purged separately by opening that valve and closing the rest.

Process

Figure 4:
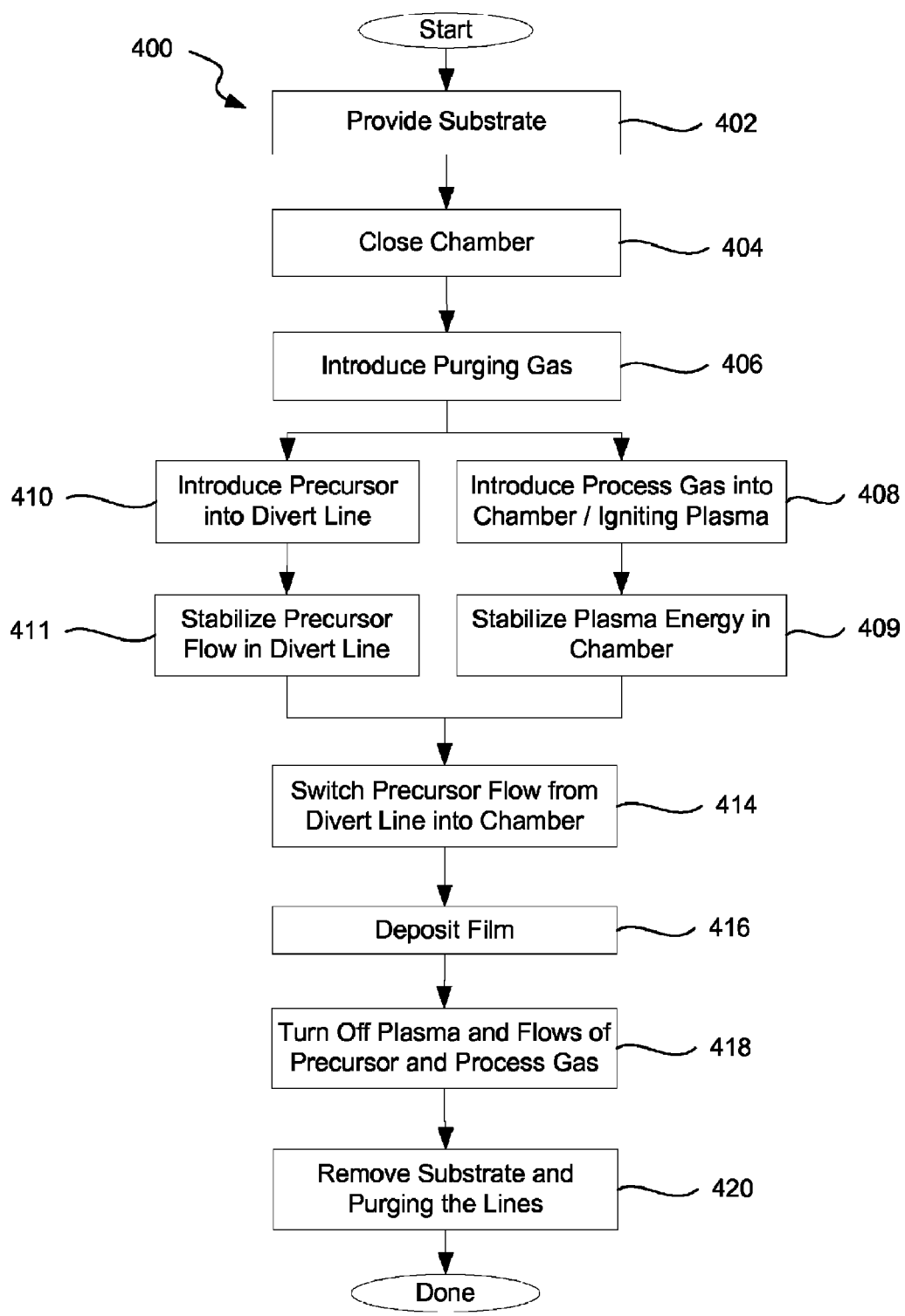
FIG. 4 depicts selected stages in a deposition process flow in accordance with certain embodiments.

FIG. 4 is a general flowchart depicting one illustrative process in accordance with some embodiments of the invention. The process 400 begins with a substrate being introduced into the deposition chamber. The substrate is positioned on a heated pedestal (block 402). The substrate starts heating up on the pedestal, which is usually maintained at temperature described in the context of FIG. 2.

The deposition chamber is then closed (block 404), for example, by closing a slit valve through which the substrate was introduced into the chamber. A purge gas is flown into the chamber (block 406). The purge gas can be, for example, oxygen, ozone, argon, helium, carbon dioxide, nitrous oxide or nitrogen, or a combination of these gases. The purge gas is substantially free of the reactant process. Purging gas may be discontinued at some point, and the substrate may be then indexed.

After between about 5 seconds and 20 seconds, the flow of the purging gas is discontinued and the process gas may be introduced into the system. The process gas may include oxygen, ozone, helium that are flow at between about 5 SLM and 25 SLM. The timing of introduction the process gas usually depends on the current temperature of the substrate. The substrate may be already heated to at least about 60% of its set point temperature. Initially, the wafer temperature may be about 25° C. and the pedestal temperature may be between about 350° C. and 425° C. The wafer temperature then rises to between about 270° C. and 370° C. during the plasma ignition.

One or more RF generators are activated to ignite plasma using the process gas (block 408). The process gases may be flown through the heated injection module before being introduced into the mixing bowl where they can be further mixed with other gases. The uniform mixture then flows through the showerhead into the deposition chamber. The LF generator may be set to between about 800 W and 2,200 W, while the HF generator may be set to between about 200 W and 700 W. It may take no more than about 4 seconds, or more specifically no more than about 2 seconds, for the plasma power to stabilize (block 409).

While the plasma is being ignited (block 408) and stabilized (block 409) in the deposition chamber, the liquid precursor is introduced into a divert line (block 410) as described in the context of FIG. 3. The flow of the precursor is stabilized while being flown into the divert line (block 411). The stabilization of the precursor flow and the stabilization of the plasma power is typically done in parallel to increase the overall process throughput; however other arrangements are possible. Usually the stabilization periods for these process parameters are aligned in such way that all process parameters are stabilized at about the same time to avoid unnecessary waste of precursors, process gases, or process time.

One skilled in the art will recognize that this invention may apply to any liquid precursor likely to condense on a cold substrate, in addition to TEOS and TEOS variants. Other such precursor candidates include tetramethoxysilane (TMOS), fluorotriethoxysilane (FTES), trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane (VSI2), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (HMODS), bis(triehtoxysilyl)ethane (BTEOSE), bis(trimethoxysilyl)ethane (BTMOSE), dimethylethoxysilane (DMEOS), tetraethoxydimethyldisiloxane (TEODMDSO), tetrakis(trimehtylsiloxy)silane (TTMSOS), tetramethyldiethoxydisiloxane (TMDEODSO), triethoxysilane (TIEOS), trimethoxysilane (TIMEOS), or tetrapropoxysilane (TPOS). In general, other precursor candidates include various liquid siloxanes (linear and cyclic) and silanes.

Upon completing both stabilization operations (blocks 409 and 411), the flow of the precursor is switched from the divert line and into the deposition chamber (block 414) initiating film deposition (block 416). The deposition 416 may last between about 1 seconds and 20 seconds, depending on the rate of deposition and required film thickness. A liquid precursor PECVD is typically used to deposit films that are between about 100 angstroms and 20,000 angstroms thick, or more specifically between about 100 and 6,000 angstroms thick. The deposition rate depends on the precursor flow rate and film stress requirements. The deposition rate may vary between about 2,000 angstrom/min to 9,000 angstrom/min After deposition, the flows of the process gas and the precursor are turned off and the plasma is extinguished (block 418). There may be a delay between the turning of the flows and extinguishing the plasma. This delay will help burn off excess of the precursor in the deposition chamber so that the precursor will not diffuse to other stations where it may cause defects. In some instances, this delay may be skipped, i.e., the plasma may be extinguished at the same time as the reactant process gas stops. The substrate may be then removed from the chamber and the lines of the delivery system are purged (block 420). One skilled in the art will note that other sequences in addition to the one described above are possible to practice this invention.

Experimental

Figure 5A:
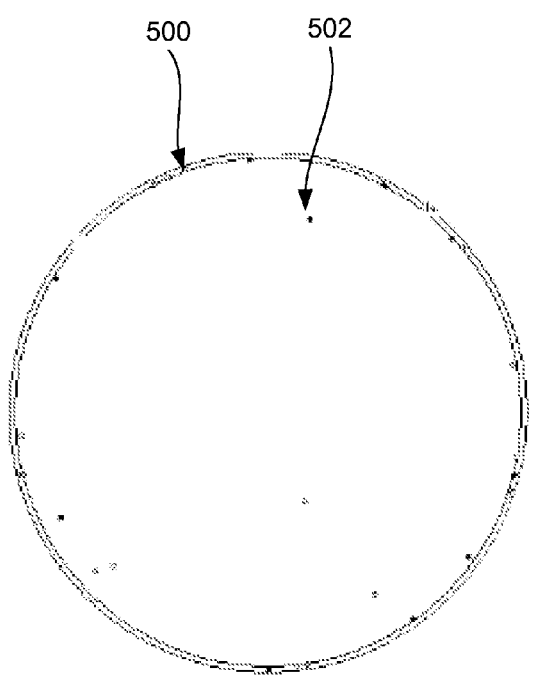
FIG. 5A illustrates an example of particle contamination of a wafer processed in a deposition system in accordance with the present invention where the liquid precursor was diverted during stabilization stages.
Figure 5B:
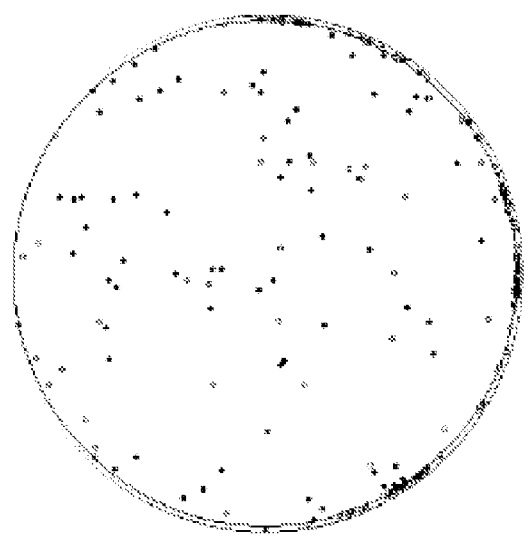
FIG. 5B illustrates an example of particle contamination of a wafer processed in a deposition system where the liquid precursor was not diverted during stabilization stages.

FIGS. 5A-B illustrate two examples of particle distributions on wafers deposited with 6,000 angstroms thick TEOS film. FIG. 5A corresponds to a wafer processed with a liquid precursor diversion in accordance with the present invention during the stabilization operations. FIG. 5B corresponds to a wafer processed without such diversion. Clearly, diverting the liquid precursors during the stabilization operations shows substantial improvement in reducing particle contamination. The experiment indicates that a wafer from the "non-divert" process had on average between 700 to 1000 particles that are 0.12 μm or greater in size. A wafer processed using the "divert" process exhibited on average fewer than 10 particles of the same size per wafer.

While the invention is not limited to any particular theory of operation, it is believed that the performance improvement derives from two different mechanisms. First, the liquid divert system prevents formation of condensed precursor particles and adsorption of thermally decomposed species. Second, the liquid divert hardware allows for ignition of the plasma using only process gases and not the liquid precursor. Once the stable plasma power is achieved, the reactive liquid precursor is injected into the process chamber for deposition. There is no liquid precursor during the ignition transient envelope to generate ignition related particles.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

All references cited herein are incorporated by reference for all purposes

What is claimed is:

1. A liquid precursor delivery system for stabilizing a flow of a liquid precursor and delivering the stabilized flow into a deposition chamber, the system comprising:
   (a) a process line configured to connect with a deposition chamber inlet and to deliver the stabilized flow of the liquid precursor into the deposition chamber;
   (b) a divert line; and
   (c) a first valve-injector assembly comprising:
      (i) a divert injector connected with the divert line;
      (ii) a process injector connected with the process line; and
      (iii) a flow control mechanism connected with the divert injector and the process injector for switching the flow of the liquid precursor between the divert injector and the process injector.

2. The delivery system of claim 1, wherein the flow control mechanism comprises:
   (a) a divert valve connected with the divert injector; and
   (b) a process valve connected with the process injector, wherein the process valve is configured to open only when the divert valve is closed.

3. The delivery system of claim 1, wherein the flow control mechanism comprises a three-way valve.

4. The delivery system of claim 1, wherein the divert injector is configured to control a flow rate of the liquid precursor into the divert line and the process injector is configure to control a flow rate of the liquid precursor into the process line such that the flow rate into the divert line is within about 10% from the flow rate into the process line.

5. The delivery system of claim 1, further comprising a second valve-injector assembly configured to control a second flow rate of the liquid precursor that is higher than a first flow rate controlled by the first valve-injector assembly.

6. The delivery system of claim 1, wherein a first flow rate controlled by the first valve-injector assembly is between about 1 ml/sec and 10 ml/sec.

7. The delivery system of claim 5, wherein the first flow rate is between about 1 ml/sec and 10 ml/sec and the second flow rate is between about 10 ml/sec and 30 ml/sec.

8. The delivery system of claim 1, further comprising a purging line for purging a first valve-injector assembly when the liquid precursor is not flown through the delivery system.

9. The delivery system of claim 1, wherein the divert line is configured to provide a flow of a carrier gas at between about 10 SLM and 50 SLM and maintain the temperature of the carrier gas at between about 100° C. and 200° C.

10. The delivery system of claim 1, wherein the process line comprises a heated injection module connected with the process injector and configured to maintain the temperature of the liquid precursor flown through the process line at greater than about 80° C. before entering the deposition chamber inlet.

11. The delivery system of claim 10, further comprising a process gas line connected with the heated injection module, wherein the heated injection module is configured to combine the liquid precursor from the process injector and one or more process gases from the process gas line and maintain the temperature of the combination at greater than about 80° C. entering the deposition chamber inlet.

12. The delivery system of claim 1, further comprising a delivery system controller configured to control operation of the flow control mechanism and execute a set of instructions, the set of instructions including:
   (a) instructions for initiating the flow of the liquid precursor into the divert line;
   (b) instructions for stabilizing the flow of the liquid precursor while the liquid precursor continues to flow into the divert line; and
   (c) instructions for introducing the stabilized flow of the liquid precursor into the process line.

13. The delivery system of claim 12, wherein the stabilized flow of the liquid precursor varies less than about 10% before and after the introducing into the process line.

14. A deposition system for depositing a semiconductor film from a liquid precursor, the deposition system comprising:
- (a) a deposition chamber including a deposition chamber inlet;
- (b) a RF generator for generating plasma in the deposition chamber using a process gas;
- (c) a liquid precursor delivery system comprising
  - (i) a divert line; and
  - (ii) a first valve-injector assembly comprising:
    - (1) a divert injector connected with the divert line;
    - (2) a process injector connected with the deposition chamber inlet and configured to deliver a stabilized flow of the liquid precursor into the deposition chamber; and
    - (3) a flow control mechanism connected with the divert injector and the process injector for switching a flow of the liquid precursor between the divert injector and the process injector.

15. The deposition system of claim 14, wherein the liquid precursor delivery system is configured to switch the flow after a plasma power is stabilized.

16. The deposition system of claim 14, wherein the liquid precursor delivery system is configured to switch the flow after between about 0.5 seconds and 3 seconds from igniting the plasma in the deposition chamber.

17. The deposition system of claim 14, wherein the liquid precursor delivery system is configured to introduce the flow of the liquid precursor into the deposition at a flow rate of between about 10 ml/sec and 30 ml/sec.

18. The deposition system of claim 14, further comprising a deposition system controller configured to execute a set of instructions, the set of instructions including:
- (a) instructions for initiating a flow of the liquid precursor into the divert line;
- (b) instructions for initiating a flow of one or more processes gases into the deposition chamber;
- (c) instructions for igniting the plasma using the RF generator and the one or more processes gases;
- (d) instructions for stabilizing the flow of the liquid precursor while the liquid precursor continues to flow into the divert line;
- (e) instructions for stabilizing power of the plasma; and
- (f) instructions for introducing the stabilized flow of the liquid precursor into the deposition chamber after the power of the plasma is stabilized.

19. A deposition method of forming a dielectric material on a semiconductor substrate, the deposition method comprising:
- (a) initiating a flow of a liquid precursor into a divert line;
- (b) initiating a flow of one or more processes gases into a deposition chamber;
- (c) igniting a plasma using a RF generator and the one or more processes gases;
- (d) stabilizing the flow of the liquid precursor while the liquid precursor continues to flow into the divert line;
- (e) stabilizing power of the plasma; and
- (f) delivering the stabilized flow of the liquid precursor into the deposition chamber after the power of the plasma is stabilized.

20. The deposition method of claim 19, wherein the stabilized flow is introduced into the deposition chamber within 0.5 seconds from stabilizing the power of the plasma.

21. The deposition method of claim 19, wherein the initiating the flow of the liquid precursor into the divert line is synchronized in time with the igniting the plasma such that the flow of the liquid precursor and the power of the plasma are stabilized within 0.5 seconds.

22. The deposition method of claim 19, wherein the liquid precursor comprises one or more tetra-ethyl-ortho-silicates.

23. The deposition method of claim 18, wherein the stabilized flow is introduced into the deposition chamber at between about 10 ml/sec and 30 ml/sec.

24. The deposition method of claim 19, wherein the stabilizing the flow of the liquid precursor continues for between about 0.5 seconds and 3.0 seconds.

25. The deposition method of claim 14, wherein the divert line is maintained at between about 3 Torr and 150 Torr and has a flow rate of 3 SLM and 10 SLM of a divert gas at between about 100° C. and 200° C.

26. The deposition method of claim 25, wherein the divert gas comprises nitrogen.

27. The deposition method of claim 19, wherein a flow rate of the stabilized flow into the divert line is within 10% of a flow rate of the stabilized flow into the deposition chamber.

* * * * *